United States Patent
Yamashita et al.

(10) Patent No.: US 12,265,335 B2
(45) Date of Patent: Apr. 1, 2025

(54) ALIGNMENT-OVERLAY MARK AND METHOD USING THE SAME

(71) Applicant: MICRON TECHNOLOGY, INC., Boise, ID (US)

(72) Inventors: Kazuko Yamashita, Hiroshima (JP); Toshiharu Nishiyama, Hiroshima (JP)

(73) Assignee: Micron Technology, Inc., Boise, ID (US)

( * ) Notice: Subject to any disclaimer, the term of this patent is extended or adjusted under 35 U.S.C. 154(b) by 112 days.

(21) Appl. No.: 17/933,968

(22) Filed: Sep. 21, 2022

(65) Prior Publication Data

US 2024/0096813 A1    Mar. 21, 2024

(51) Int. Cl.
*G03F 7/00* (2006.01)
*G03F 9/00* (2006.01)

(52) U.S. Cl.
CPC ...... *G03F 7/70683* (2013.01); *G03F 7/70633* (2013.01); *G03F 9/7046* (2013.01); *G03F 9/7076* (2013.01)

(58) Field of Classification Search
CPC ........ G03F 9/7046; G03F 9/7076; G03F 9/70; G03F 9/7003–7015; G03F 9/7023–7034; G03F 9/7049; G03F 9/7069; G03F 9/7073–7088; G03F 9/7092; G03F 9/7096; G03F 7/70; G03F 7/70483–70541; G03F 7/70616–70683; G03F 7/705; G03F 7/70605–706851; H01L 23/544; H01L 22/30; H01L 2223/54426; H01L 2223/5446

USPC ...... 355/18, 30, 52–55, 67–77; 356/399–401
See application file for complete search history.

(56) References Cited

U.S. PATENT DOCUMENTS

| | | | | |
|---|---|---|---|---|
| 6,536,130 | B1* | 3/2003 | Wu | G03F 7/70641 33/645 |
| 2002/0180067 | A1* | 12/2002 | Hoshi | H01L 23/544 257/E23.179 |
| 2008/0036984 | A1* | 2/2008 | Mos | G03F 7/70616 355/72 |
| 2009/0040536 | A1* | 2/2009 | Chiu | G03B 27/42 355/77 |
| 2013/0075938 | A1* | 3/2013 | Yang | G03F 1/42 257/E23.179 |
| 2015/0200165 | A1* | 7/2015 | Shiba | H01L 21/3086 257/797 |
| 2018/0182713 | A1* | 6/2018 | Shiba | H01L 21/3086 |
| 2020/0219821 | A1* | 7/2020 | Cheng | H01L 23/544 |

FOREIGN PATENT DOCUMENTS

JP      2017207727 A    11/2017

* cited by examiner

*Primary Examiner* — Christina A Riddle
(74) *Attorney, Agent, or Firm* — Dorsey & Whitney LLP

(57) ABSTRACT

According to one or more embodiments of the disclosure, an alignment-overlay mark is provided. The alignment-overlay mark includes a pair of first marks and a plurality of second marks. The first marks extend in a first direction and are arranged in parallel to each other in a second direction. The second direction is perpendicular to the first direction. The second marks are between the first marks, extend in the second direction and are arranged in parallel to each other in the first direction.

11 Claims, 14 Drawing Sheets

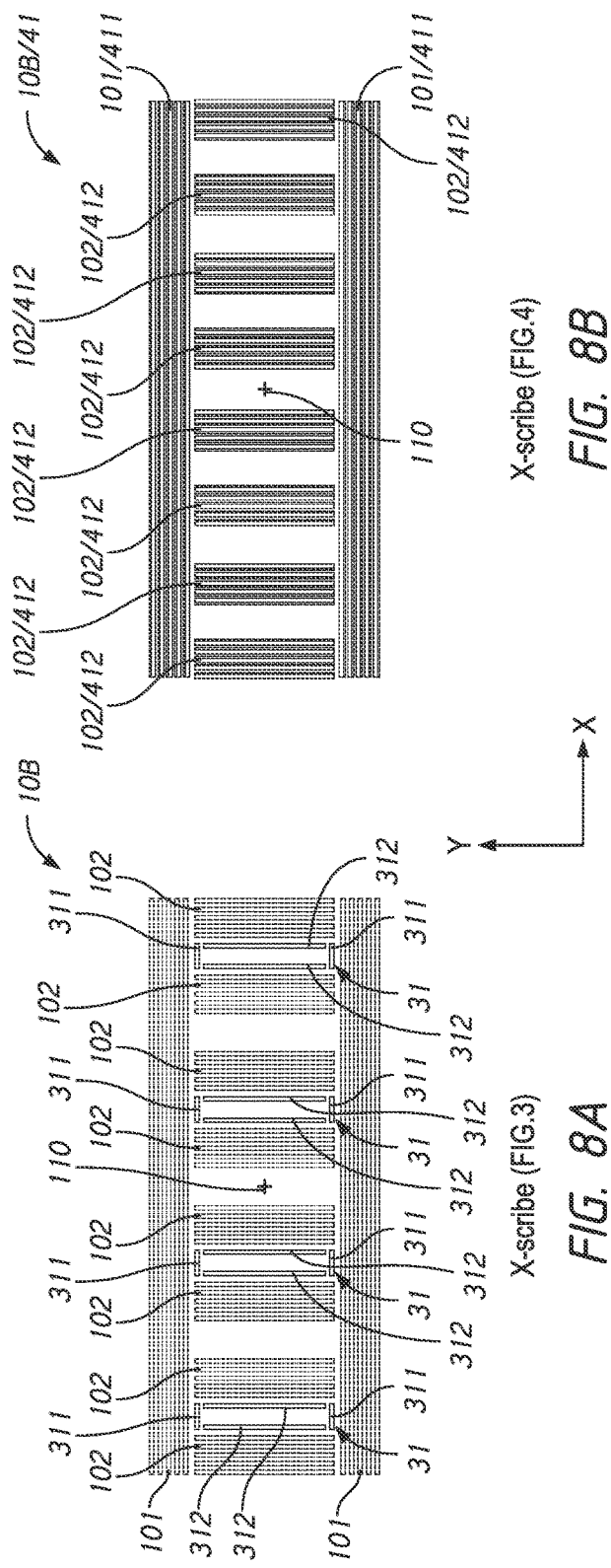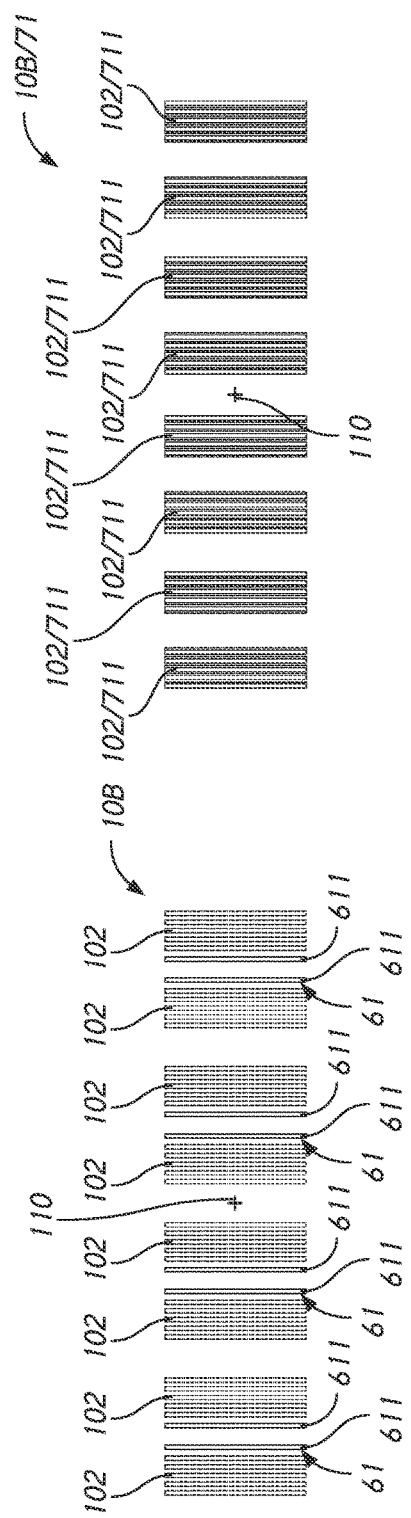

ALIGNMENT-OVERLAY MARK AND METHOD USING THE SAME

BACKGROUND

A plurality of semiconductor integrated circuit (IC) chips may be printed on a semiconductor wafer by a lithography apparatus. IC chips may be or may include memory chips, such as dynamic random access memory (DRAM) chips or static random access memory (SRAM) chips. A lithography apparatus is a machine to project circuit patterns of a reticle onto a layer of radiation-sensitive material, such as resist, on a wafer. The lithography apparatus may be of a scanner type or a stepper type. Each IC chip may be formed by overlaying a plurality of pattern layers on top of each other. Pattern layers include respective circuit patterns which, when overlaid, form a final circuit pattern. To accurately print an upper pattern layer on a lower pattern layer, alignment is performed using an alignment mark and an overlay mark.

As one lithographic technique, double patterning may be used to form a target circuit pattern on a pattern layer. For example, the target circuit pattern is split into two sub-patterns, a first sub-pattern is formed on the pattern layer, and subsequently a second sub-pattern is formed at an appropriate position with respect to the first sub-pattern on the same pattern layer to complete the final, target circuit pattern. In the double patterning, alignment is also performed to accurately position sub-patterns with respect to each other by using an alignment mark and an overlay mark.

The alignment mark and the overlay mark are separately arranged in a scribe (may also be referred to as a scribe line or a scribe space) of a wafer. A wafer may have a plurality of scribes. Each scribe is provided between neighboring IC chips or dies on the wafer. The scribes are where the wafer is diced into a plurality of single IC chips.

As the number of lithography steps increases to achieve miniaturization of IC chips to a greater extent, or as the size of each scribe on a wafer is made smaller while IC chips are further miniaturized and more IC chips are to be formed on the wafer, the space for the alignment mark and the overlay mark on the wafer is decreased, and securing such space is getting even harder.

BRIEF DESCRIPTION OF THE DRAWINGS

FIGS. 8A-8D depict alignment-overlay marks and resist patterns in a plan view according to an embodiment of the disclosure.

DETAILED DESCRIPTION

Figure 1:
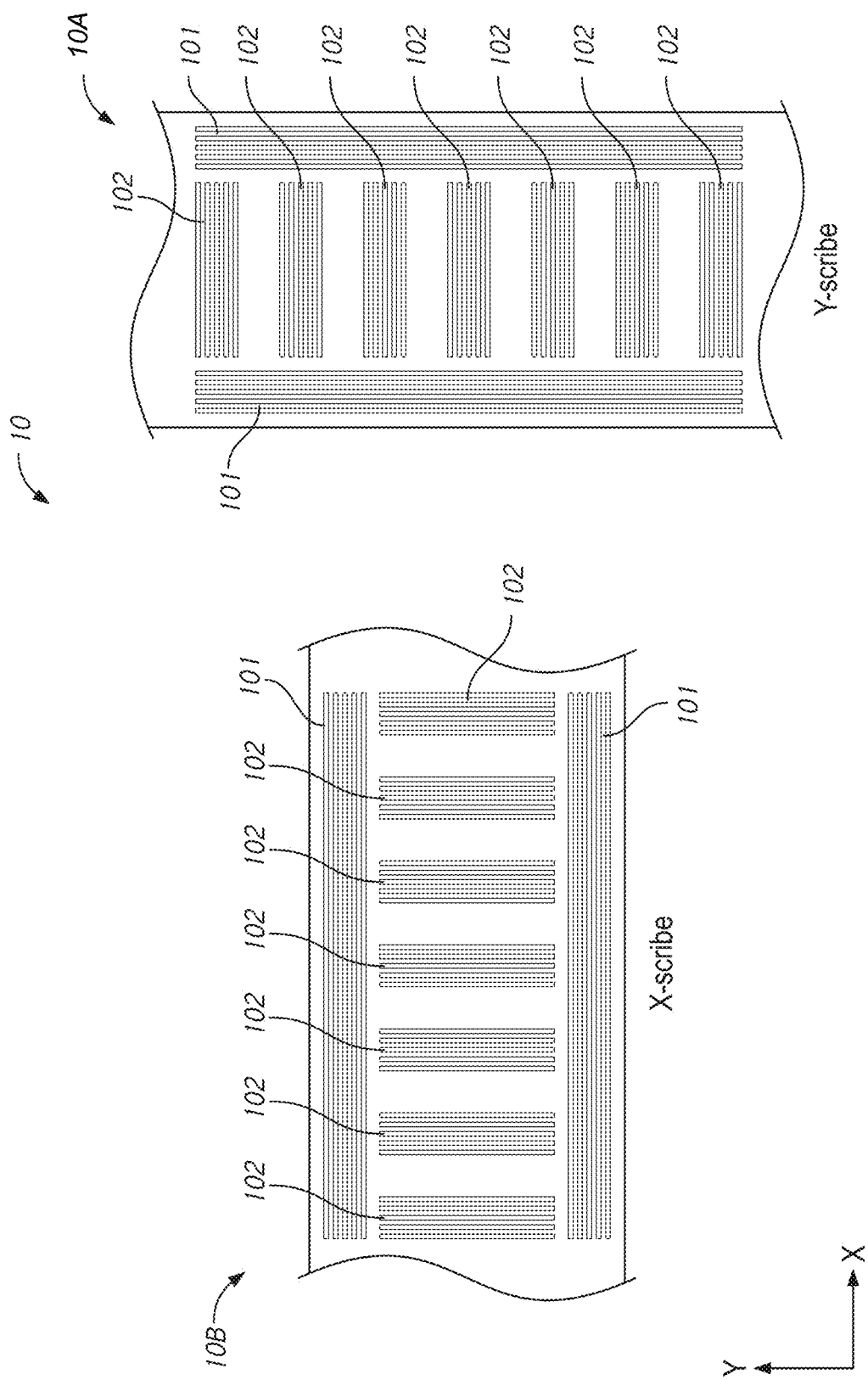
FIG. 1 depicts a schematic configuration of an alignment-overlay mark in a plan view according to an embodiment of the disclosure.

Various example embodiments of the disclosure will be described below in detail with reference to the accompanying drawings. The following detailed descriptions refer to the accompanying drawings that show, by way of illustration, specific aspects in which embodiments of the disclosure may be practiced. These embodiments are described in sufficient detail to enable those skilled in the art to practice the disclosure. Other embodiments may be utilized, and structure, logical and electrical changes may be made without departing from the scope of the disclosure. The various embodiments disclosed herein are not necessary mutually exclusive, as some disclosed embodiments can be combined with one or more other disclosed embodiments to form new embodiments.

In the descriptions, common or related elements and elements that are substantially the same are denoted with the same signs, and the descriptions thereof may be reduced or omitted. In the drawings, the dimensions and dimensional ratios of each unit do not necessarily match the actual dimensions and dimensional ratios in the embodiments.

FIG. 1 depicts an example of an alignment-overlay mark 10 in a plan view according to an embodiment of the disclosure. The alignment-overlay mark 10 according to the present embodiment serves as both an alignment mark and an overlay mark, and hence, may also be referred to as an alignment-overlay combination mark or simply a frame mark comprising an alignment mark part and a combination mark part. In FIG. 1, an alignment-overlay mark 10A as the alignment-overlay mark 10 provided in a scribe (may also be referred to as a Y-scribe) extending in Y direction and an alignment-overlay mark 10B as the alignment-overlay mark 10 provided in a scribe (may also be referred to as an X-scribe) extending in X direction are illustrated. X and Y directions are perpendicular to each other in the drawing. The Y-scribe and the X-scribe are provided between neighboring chip areas (may also be referred to as die areas) or adjacent to the chip areas.

The alignment-overlay mark 10 includes a pair of first marks 101 extending in a first direction and arranged in parallel to one another in a second direction. The first and second directions are perpendicular to each other. In the Y-scribe, the two first marks 101 of the pair extend in Y direction (the first direction) and are arranged in parallel in X direction (the second direction). In the X-scribe, the two first marks 101 of the pair extend in the X direction (the first direction) and are arranged in parallel in Y direction (the second direction). The pair leaves a space therebetween.

The alignment-overlay mark 10 further includes a plurality of second marks 102 in the space between the pair of first marks 101. The second marks 102 extend in a third direction and are arranged in parallel to each other in a fourth direction. The third and fourth directions are perpendicular to each other. The third direction is perpendicular to one of the first and second directions of the first mark 101, and the fourth direction is perpendicular to another of the first and second directions of the first mark 101. In the Y-scribe, the third and fourth directions are X and Y directions, respectively. In the X-scribe, the third and fourth directions are Y and X directions, respectively.

Each of the first marks 101 includes a plurality of bars running in Y direction in the Y-scribe or X direction in the X-scribe and arranged in parallel to each other in X direction in the Y-scribe or Y direction in the X-scribe. The bars are equally or substantially equally distanced from each other with a gap therebetween in Y direction in the Y-scribe or X direction in the X-scribe. A number of the bars included in each first mark 101 may be determined based on, for example, alignment requirements and/or specifications required to achieve an intended alignment quality. These bars and gaps (may also be referred to as lines and spaces) form a grating.

Each of the second marks 102 includes a plurality of bars running in X direction in the Y-scribe or Y direction in the X-scribe and arranged in parallel to each other in Y direction in the Y-scribe or X direction in the X-scribe. The bars are equally or substantially equally distanced from each other with a gap therebetween in X direction in the Y-scribe or Y direction in the X-scribe. A number of the bars included in each second mark 102 may be determined based on, for example, alignment requirements and/or specifications required for achieving an intended alignment quality. These bars and gaps (may also be referred to as lines and spaces) form a grating.

Figure 2:
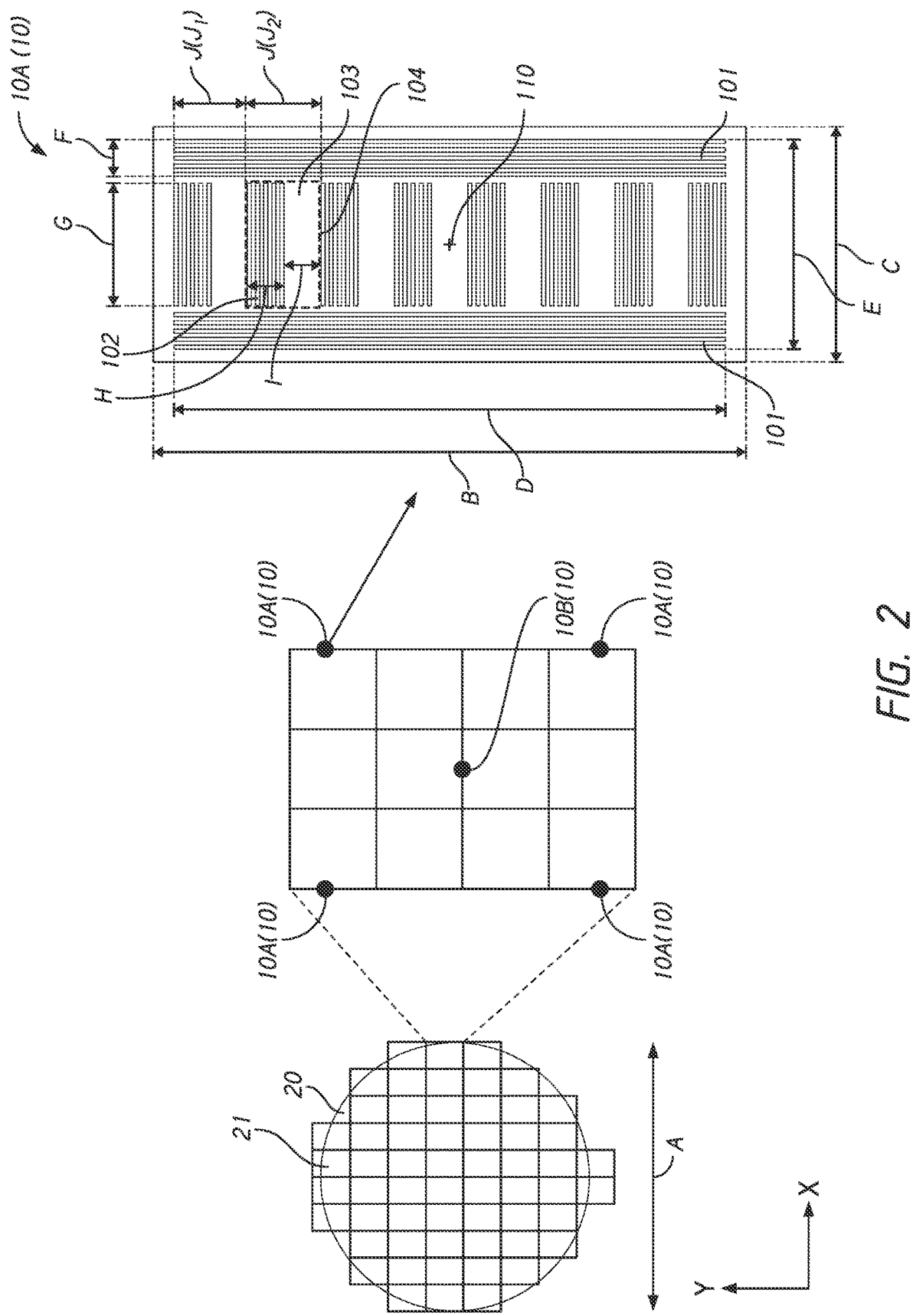
FIG. 2 depicts a wafer and a scribe layout including an alignment-overlay mark in a plan view according to an embodiment of the disclosure.

FIG. 2 depicts an example of a wafer and a scribe layout including the plurality of alignment-overlay marks 10A and 10B in a plan view according to an embodiment of the disclosure. As shown in FIG. 2, a wafer 20 includes a plurality of chips (or dies) 21. On the wafer 20, a plurality of Y-scribes and X-scribes are provided between the neighboring chips 21. The alignment-overlay marks 10A and 10B are provided to the Y-scribes and X-scribes at appropriate positions to be used for alignment.

In the drawing, for the sake of simplicity, only one alignment-overlay mark 10A in one Y-scribe is illustrated in an enlarged view; however, other alignment-overlay marks 10A and 10B in other Y- and X-scribes have the same or substantially the same configurations and sizes as those of the illustrated alignment-overlay mark 10A. For example, for the alignment-overlay mark 10B in the X-scribe, the same sizes of the corresponding elements to those of the illustrated alignment-overlay mark 10A are applicable by switching Y and X directions (or by rotating the alignment-overlay mark 10A 90 degrees). Further, the sizes described herein represent merely one example; other sizes are applicable as appropriate. Also, for the sake of simplicity, only one of the second marks is indicated with the sign 102; however, as shown in FIG. 1, the plurality of second marks share the same sign. The alignment-overlay mark 10A depicted in FIG. 2 has eight second marks 102 while the alignment-overlay mark 10A depicted in FIG. 1 has seven second marks 102. The number of the second marks 102 may be arbitrarily determined based on, for example, alignment requirements and/or specifications required for achieving an intended alignment quality.

As one example illustrated in FIG. 2, the wafer 20 has a diameter A of 300 mm. The Y-scribe, or at least part of the Y-scribe secured for the alignment-overlay mark 10A on the wafer 20, has a length B of 125 μm (hereinafter "um" indicating micrometer or $10^{-6}$ meter) and a width C of 40 um.

The alignment-overlay mark 10A in the Y-scribe has an overall length D of 120 um in Y-direction and an overall width E of 38 um in X-direction. The overall length D is the same as a Y-direction length of each of the first marks 101. The overall width E is the same as an X-direction length or width of the pair of the first marks 101. The width E is measured between the outermost bars (more specifically, between outer surfaces of the outermost bars) of the right and left side first marks 101. Each of the first marks 101 has a width F of 8 um in X-direction.

Each of the second marks 102 between the first marks 101 has a length G of 20 um in X direction and a length H of 8 um in Y direction. The length G of 20 um indicates that there is a space with a length of greater than 20 um in X direction between the innermost bars (more specifically, between inner surfaces of the innermost bars) on the right and left side first marks 101, and the second marks 102 are arranged in that space sandwiched by the two first marks 101. Between neighboring second marks 102, there is a gap (may also be referred as a space or a separation) 103 with a length I of 8 um in Y direction. The Y-direction length H and the Y-direction length I provides a pitch J of 16 um between the neighboring second marks 102 in Y direction.

These lengths H and I and hence the pitch J remains the same for all second marks 102 in the alignment-overlay mark 10A. For example, as shown in the drawing, a first pitch $J_1$ between the first two neighboring second marks 102 and a second pitch $J_2$ between the next two neighboring second marks 102 are the same with each other. The same goes for the rest of the neighboring second marks 102.

In the example, the length H of the second mark 102 is the same as the length I of the gap 103. The second mark 102 of the length H and the gap 103 of the length I together define one segment 104. This segment 104 has an area size equally or substantially equally split between the second mark 102 and the gap 103. The second mark 102 occupies one half (50%) or substantially one half of the segment 104, and the gap 103 occupies another half (50%) or substantially another half of the segment 104. The same goes for the rest of the second marks 102 and gaps 103. All second marks 102 and gaps 103 define the segments of the same size. (Not all of the gaps are indicated with the sign 103 in the drawing for the sake of simplicity.)

The plurality of second marks 102 together with the corresponding gaps 103 therebetween forms a grating sandwiched between the two first marks 101.

In the drawing, a center 110 of the alignment-overlay mark 10 in both Y and X directions is indicated as a cross.

In the example, the alignment-overlay marks 10 A and 10B are provided to some of the Y-scribes and the X-scribes on the wafer 20, using less scribe space. These alignment-overlay marks 10A and 10B having the above-described configuration and size can achieve the same or substantially the same alignment quality as that achieved by conventional alignment marks and overlay marks. The alignment-overlay mark 10 according to the present embodiment is a combination of an alignment mark and an overlay mark designed for both wafer alignment and overlay alignment, requiring less scribe space on the wafer 20 while maintaining the alignment quality.

In one example, only the alignment-overlay marks 10A and 10B may be provided on the wafer 20. In another example, conventional alignment marks and overlay marks may be provided to the Y- and X-scribes where the alignment-overlay marks 10A and 10B are not provided.

Figure 3A:
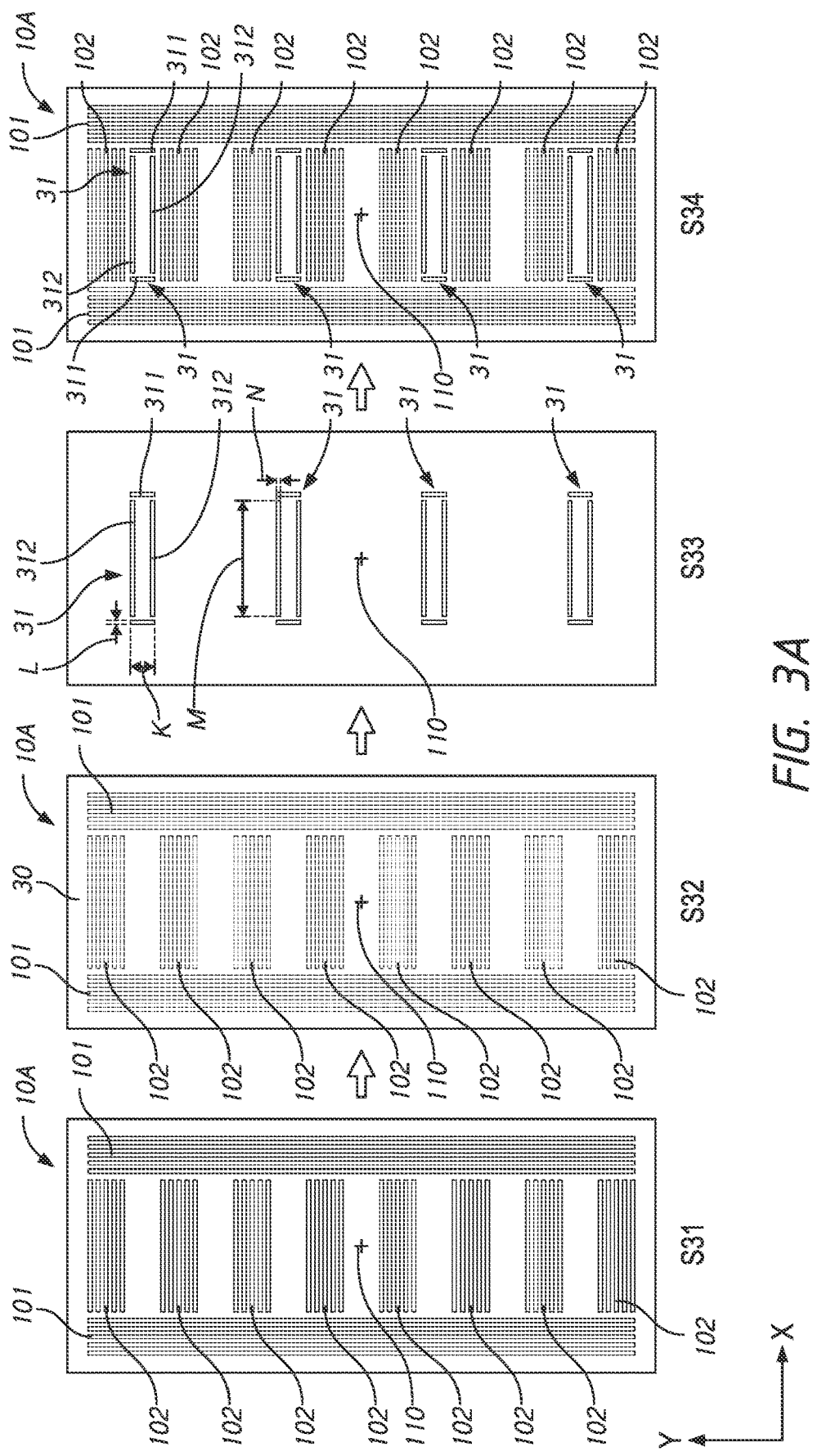
FIGS. 3A and 3B depict a method of alignment using an alignment-overlay mark according to an embodiment of the disclosure.
Figure 3B:
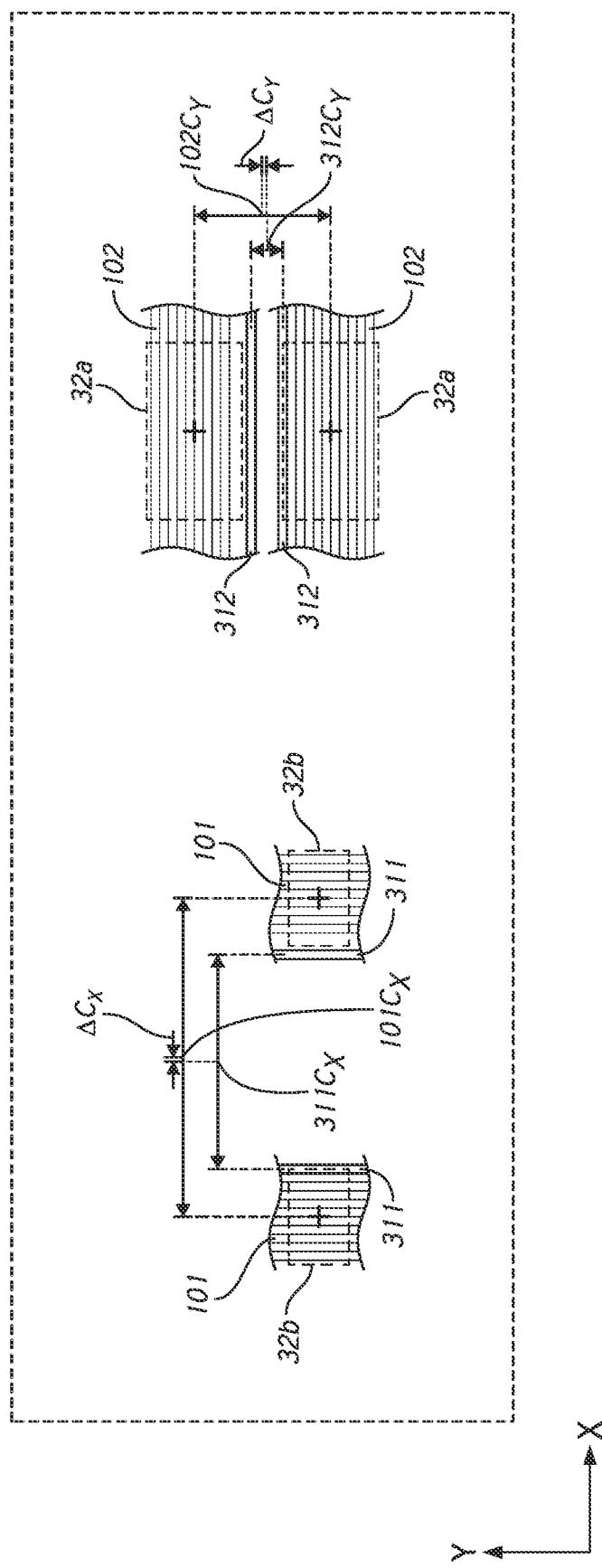

FIGS. 3A and 3B depict an example of a method of alignment using the alignment-overlay mark 10A (10) of FIG. 2 according to an embodiment of the disclosure.

As shown in FIG. 3A, prior to the alignment, the alignment-overlay mark 10A (10) is formed or printed in the Y-scribe (or X-scribe in the case of the alignment-overlay mark 10B (see FIG. 8A)) on the wafer by a lithography apparatus (S31). For example, first, an exposure process is performed to expose certain areas, which are to form the alignment-overlay mark 10, of a layer of resist provided on a semiconductor substrate of a wafer with exposure light, an exposure beam, or the like. A development process is then performed to remove unexposed areas of the resist and leave the exposed areas on the substrate. Etching is performed to further shape the exposed areas on the substrate. Structures or patterns left on the substrate after these processes as well as some other appropriate processes provide the alignment-overlay mark 10 in a first layer. Printing of the alignment-overlay mark 10 in the Y- or X-scribe may be performed at the same time as printing circuit patterns in circuit (or die) areas in the first layer by the same lithography apparatus. This first layer is, for example, a lower pattern layer of a plurality of pattern layers to be overlaid to provide a final circuit pattern of each IC chip on the wafer. In double patterning, the first layer includes a first sub-pattern of a final, full circuit pattern. The alignment-overlay mark 10 and the circuit patterns to be printed on the first layer are, for example, provided to a first reticle designed for the first pattern layer. Any appropriate, conventional methods can be used for the mark and circuit pattern printing in the first layer. The lithography apparatus may be of a scanner type or a stepper type.

Subsequently, another resist layer 30 as a second (or current) layer is deposited over the first (or previous) layer including the alignment-overlay mark 10A (S32).

As a first stage of the alignment (S32), a wafer alignment process is performed in the current layer by using the alignment-overlay mark 10A (10) through the deposited resist layer 30 by the same lithography apparatus that has formed the previous layer. For example, the wafer alignment aligns the center 110 of the alignment-overlay mark 10A to a predetermined position. The predetermined position includes but is not limited to a center of a reticle (not separately depicted). The wafer alignment may also be referred to as scanner alignment in case of the lithography apparatus of the scanner type. Determining the center 110 of the alignment-overlay mark 10A and using such center for the wafer alignment may be done by any appropriate conventional methods.

Next, a plurality of resist patterns 31 are formed or printed in the current resist layer by the lithography apparatus (S33) through lithography processing as well as other appropriate processing. Printing of the resist patterns 31 may be performed at the same time as printing circuit patterns in circuit (or die) areas in the second layer by the same lithography apparatus. Any appropriate, conventional methods can be used for this resist pattern and circuit pattern printing in the second layer. This second layer is, for example, an upper pattern layer of the plurality of pattern layers to be overlaid on the lower pattern layer to provide the final circuit pattern of each IC chip on the wafer. In double patterning, the second layer includes a second sub-pattern of the final, full circuit pattern. The resist patterns 31 and the circuit patterns to be printed on the second layer are, for example, provided to a second reticle designed for the second pattern layer. Any appropriate, conventional methods can be used for the mark and circuit pattern printing in the second layer.

In the example, each of the resist patterns 31 includes a pair of first bars (may also be referred to as first lines) 311 and a pair of second bars (may also be referred to as second lines) 312. The first bars 311 extend in Y direction (or X direction in the case of the alignment-overlay mark 10B in the X-scribe (see FIG. 8A)) and are arranged in parallel to each other in X direction (or Y direction in the case of the alignment-overlay mark 10B in the X-scribe (see FIG. 8A)). The second bars 312 extend in X direction (or Y direction in the case of the alignment-overlay mark 10B in the X-scribe (see FIG. 8A)) and are arranged in parallel to each other in Y direction (or X direction in the case of the alignment-overlay mark 10B in the X-scribe (see FIG. 8A)). For the sake of simplifying the drawing, only one of the resist patterns 31 is indicated with signs 311 and 312 for the corresponding first and second bars; however, all resist patterns 31 have the same structure including the first and second bars 311 and 312.

When viewed from above or in a plan view, the first bars 311 and the second bars 312 of the resist pattern 31 in the current layer fit in an area defined between the neighboring second marks 102 and between the first marks 101 of the previous layer. The first bars 311 and the second bars 312 forms substantially a box shape (without four corners) as illustrated in a plan view. The first and second bars 311 and 312 run along the first and second marks 101 and 102 in the defined area, respectively, when viewed from above. As one example, each of the first bars 311 may have a length K of 3.0 um in Y direction and a length or width L of 0.5-1.0 um in X direction. As one example, each of the second bars 312 may have a length M of 9.0 um in X direction and a length or a width N of 0.5-1.0 um in Y direction.

As a second stage of the alignment, an overlay alignment process is performed using the alignment overlay mark 10 in the previous layer and the corresponding resist pattern 31 in the current layer (S34). For example, an overlay error or overlay misalignment is measured between the alignment-overlay mark 10 of the previous layer and the resist pattern 31 of the current layer. Such measurement is performed by a metrology apparatus. For example, an Image based on Overlay (IBO) technique may be utilized by the metrology apparatus. IBO uses images of the alignment-overlay mark 10 of the previous layer and the resist pattern 31 of the current layer and compares the two images to calculate misalignment as an overlay error.

In FIG. 3B, the enlarged views illustrate IBO in Y direction (right) and X direction (left) as one example. IBO may be performed in Y direction and/or X direction to determine Y-direction and/or X-direction misalignment.

In the case of IBO in Y direction, a center $102C_Y$ between the neighboring second marks 102 in the first, previous layer in Y direction is determined. A center $312C_Y$ between the second bars 312, which correspond to the neighboring second marks 102, in the second, current layer in Y direction is also determined. The center $102C_Y$ is a position equally distanced in Y direction between a Y-direction center (indicated with a cross mark in the drawing) of one of the neighboring second marks 102 and a Y-direction center (indicated with another cross mark in the drawing) of another one of the neighboring second marks 102. The center $312C_Y$ is a position equally distanced in Y direction between the two second bars 312. In one instance, two sections 32a (may also be referred to as regions or windows for alignment inspection) designated for Y-direction overlay alignment may be defined (as indicated with a doted rectangle in the drawing) to cover at least portions of the respective neighboring second marks 102 in the image of the alignment-overlay mark 10, the centers of the defined sections 32a for the neighboring second marks 102 are obtained by image analysis, and the center $102C_Y$ is calculated based on the centers of the defined sections 32a. Likewise, the center $312C_Y$ may be obtained by analyzing the image of the alignment-overlay mark 10 capturing at least a portion of each of the second bars 312 for center calculation. A value of misalignment $\Delta C_Y$ in Y direction is then obtained by, for example, calculating a difference between the two centers $102C_Y$ and $312C_Y$.

In the case of IBO in X direction, a center $101C_X$ between the first marks 101 in the first, previous layer in X direction is determined. A center $311C_X$ between the first bars 311, which correspond to the first marks 101, in the second, current layer in X direction is also determined. The center $101C_X$ is a position equally distanced in X direction between an X-direction center (indicated with a cross mark in the drawing) of one of the first marks 101 and an X-direction center (indicated with another cross mark in the drawing) of another one of the first marks 101. The center $311C_X$ is a position equally distanced in X direction between the two first bars 311. In a similar manner to the calculation of the centers $102C_Y$ and $312C_Y$, in one instance, two sections 32b (or regions or windows for alignment inspection) designated for X-direction overlay alignment may be defined (as indicated with a doted rectangle in the drawing) to cover at least portions of the respective first marks 101 in the image of the alignment-overlay mark 10, the centers of the defined sections 32b for the first marks 101 are obtained by image analysis, and the center $101C_X$ is calculated based on the centers of the defined sections 32b. Likewise, the center $311C_X$ may be obtained by analyzing the image of the alignment-overlay mark 10 capturing at least a portion of each of the first bars 311 for center calculation. A value of misalignment $\Delta C_X$ in X direction is then obtained by, for example, calculating a difference between the two centers $101C_X$ and $311C_X$.

Figure 4A:
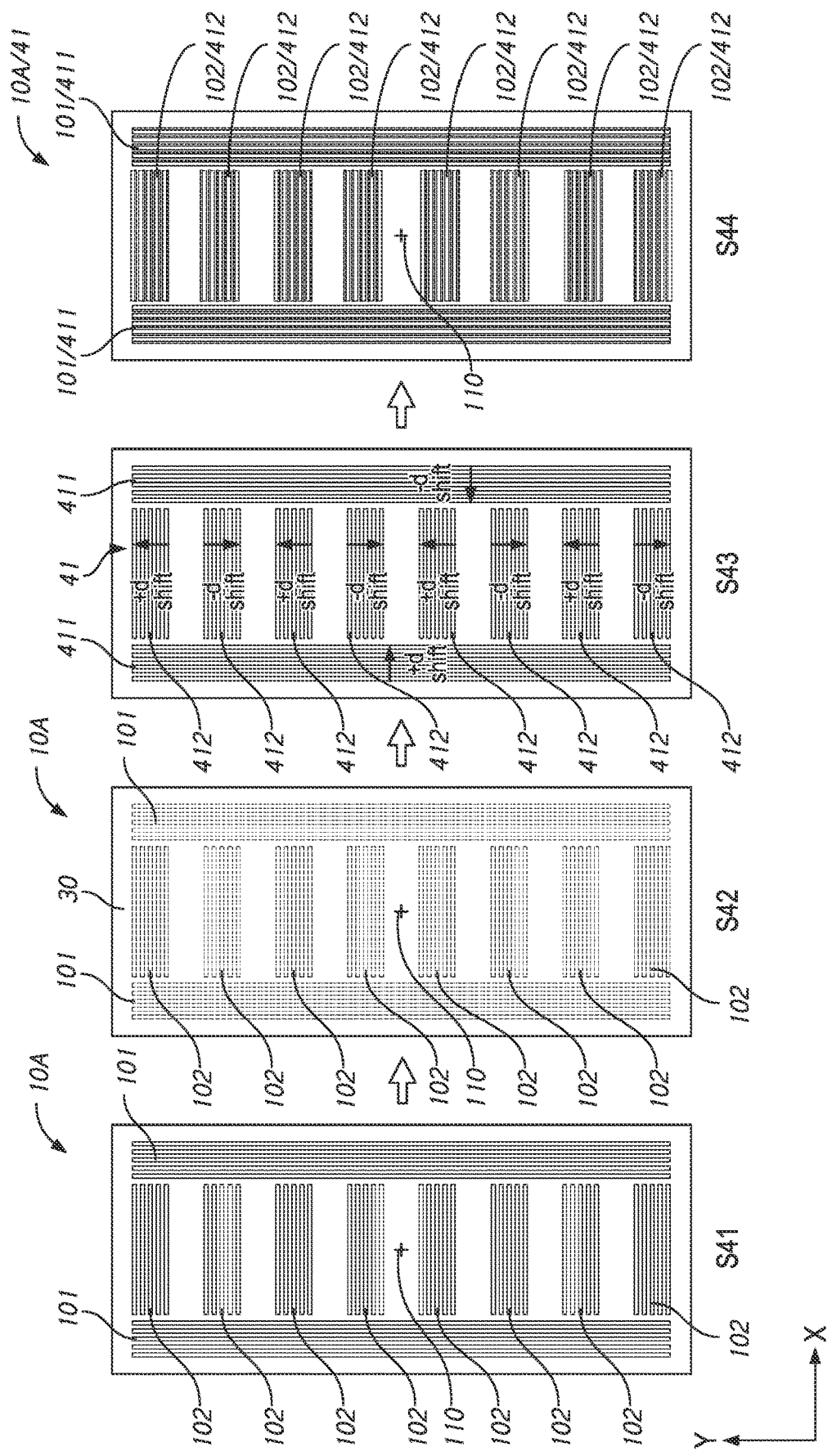
FIGS. 4A and 4B depict a method of alignment using an alignment-overlay mark according to an embodiment of the disclosure.
Figure 4B:
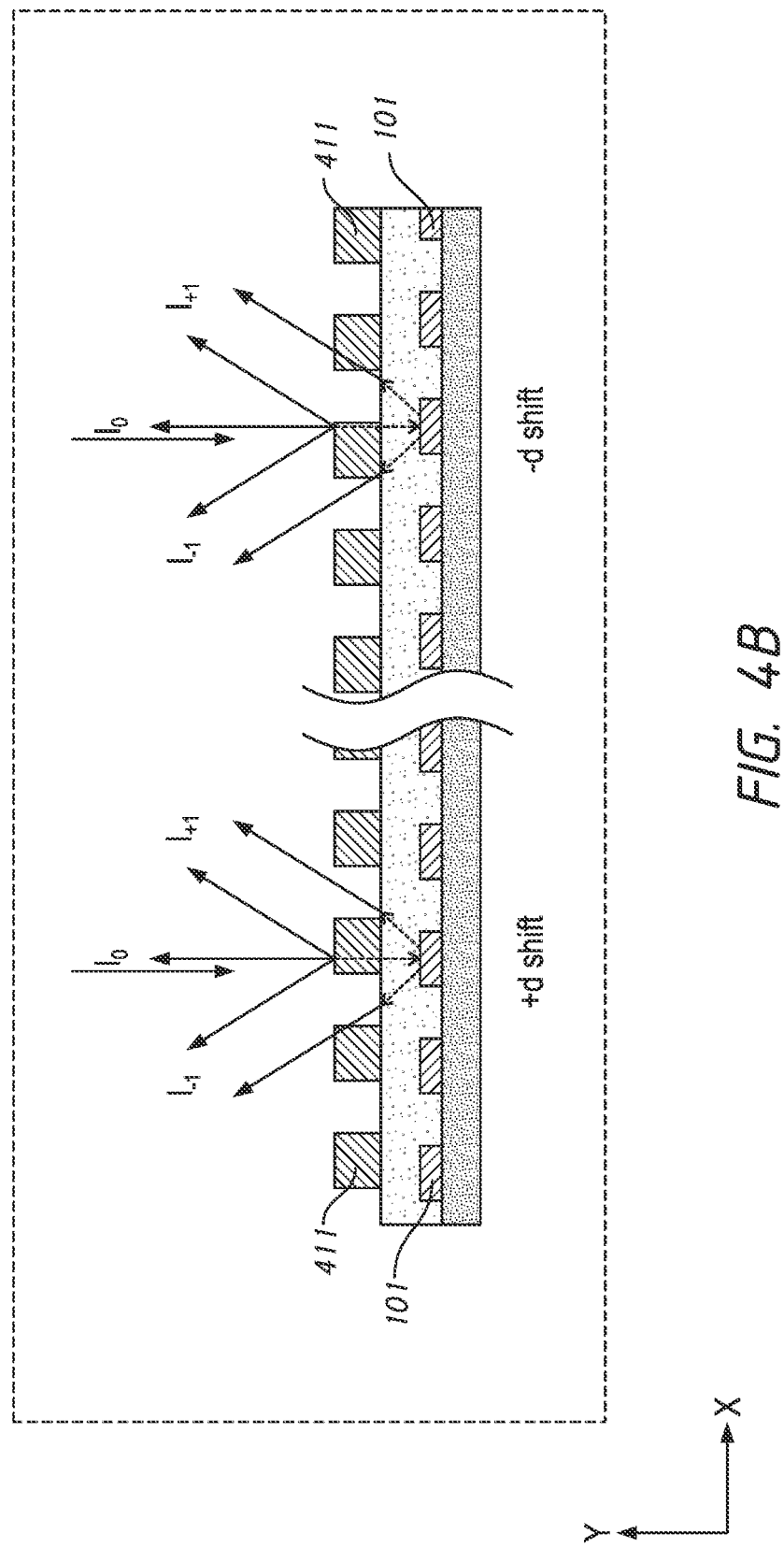

FIGS. 4A and 4B depict another example of a method of alignment using the alignment-overlay mark 10A (10) of FIG. 2 according to an embodiment of the disclosure.

In a similar manner to the example in FIG. 3A (S31 and S32), prior to the alignment, the alignment-overlay mark 10A (10) is printed in the first, previous layer in the Y-scribe (or X-scribe in the case of the alignment-overlay mark 10B (see FIG. 8B)) on the wafer by a lithography apparatus (S41), and subsequently, a resist layer 40 as the second, current layer is deposited over the previous layer including the alignment-overlay mark 10A (S42). Then, in the same manner as the example in FIG. 3A (S32), as the first stage of the alignment (S42), the wafer alignment process is performed in the current layer by using the alignment-overlay mark 10A (10) through the deposited resist layer 40 by the same lithography apparatus that has formed the previous layer.

Next, in a similar manner to the example in FIG. 3A (S33), a resist pattern 41 is formed or printed in the current resist layer by the lithography apparatus (S43), except that a structure of the resist pattern 41 is different from the resist pattern 31. The resist pattern 41 in the current layer corresponds to the alignment-overlay mark 10A in the previous layer when viewed from above.

In the example, the resist pattern 41 in the Y-scribe includes the structure that corresponds to or is substantially the same as the alignment-overlay mark 10A but is shifted, to some extent, from the alignment-overlay mark 10A in Y and X directions when viewed from above. In the drawing, such shifts are indicated as +d shift and −d shift.

The resist pattern 41 includes a pair of first patterns 411 corresponding to the pair of first marks 101, and a plurality of second patterns 412 corresponding to the plurality of second marks 102. In the example, each of the first patterns 411 includes a plurality of bars corresponding to the plurality of bars of each of the first marks 101. Each of the second patterns 412 includes a plurality of bars corresponding to the plurality of bar of each of the second marks 102.

The first patterns 411 (or the respective bars thereof) of the pair are shifted in opposite directions to each other (+d and −d) in X direction. For example, one of the first patterns 411 (or the respective bars thereof) on the right side is shifted inwardly in X direction as indicated with −d shift in the drawing. Another one of the first patterns 411 (or the respective bars thereof) on the left side is shifted inwardly opposite to the −d shift of the right-side first pattern 411 in X direction as indicated with +d shift in the drawing.

Neighboring second patterns 412 (or the respective bars thereof) among the plurality of second patterns 412 are shifted in opposite directions to each other (+d and −d) in Y direction. For example, one of the neighboring second patterns 412 (or the respective bars thereof) is shifted upwardly in Y direction as indicated with +d shift in the drawing. Another one of the neighboring second patterns 412 (or the respective bars thereof) is shifted downwardly in Y direction as indicated with −d shift in the drawing. The same goes for the rest of the second patterns 412. Every other second patterns 412 are shifted in either +d or −d. The second patterns 412 are shifted in +d and −d alternately.

With these shifts, the first patterns 411 have a shorter length in X direction therebetween than the first marks 102 when viewed from above, and the neighboring second patterns 412 have a shorter gap or pitch therebetween than the corresponding, neighboring second marks 102 when viewed from above. The shifted structures of the first and second patterns 411 and 412 of the resist pattern 41 in the Y-scribe are also applicable to a resist pattern in the X-scribe (see FIG. 8B) by switching Y and X directions (or by rotating the illustrated structures 90 degrees). Further, the shifts may be added in both Y and X directions, or may be added in only one of Y and X directions.

Based on the resist pattern 41 in the current layer and the alignment-overlay mark 10 (10A and/or 10B) in the previous layer, an overlay alignment process as a second stage of the alignment is performed (S44). For example, an overlay error or overlay misalignment is measured between the alignment-overlay mark 10 and the resist pattern 41. Such measurement is performed by a metrology apparatus. For example, a Diffraction based on Overlay (DBO) technique may be utilized by the metrology apparatus. DBO measures intensities of diffractions light or diffraction patterns (or interference fringes of the diffraction light) from the alignment-overlay mark 10 of the previous layer and the resist pattern 41 of the current layer and calculates misalignment as an overlay error based on the measured intensities.

In FIG. 4B, the enlarged view illustrates an example of DBO in X direction applied to the first marks 101 of the alignment-overlay mark 10A and the first patterns 411 of the resist pattern 41. In the example, the first patterns 411 in the second layer forms a grating (may also be referred to as a top grating) with the plurality of bars or lines, the first marks 101 in the first layer forms a grating (may also be referred to as a bottom grating) with the plurality of bars or lines (see also FIG. 1). When both top and bottom gratins are irradiated with light $I_0$, diffraction lights $I_{+1}$ and $I_{-1}$ are generated off the gratings. With the −d shift structure, for example, the diffraction light $I_{-1}$ diffracted from the top and bottom gratings to one side in X direction has a higher intensity than the diffraction light $I_{+1}$ diffracted from the top and bottom gratings to an opposite side in X direction. With the +d shift structure, for example, the diffraction light diffracted from the top and bottom gratings to one side in X direction has a higher intensity than the diffraction light $I_{-1}$ diffracted from the top and bottom gratings to another side in X direction. The diffraction light $I_{+1}$ and $I_{-1}$ are thus asymmetry in intensity. The differences in intensity then lead to an error or misalignment in overlay of the first marks 101 and the first patterns 411 by calculating, for example, $d*((I_{+1}+I_{-1})/(I_{+1}-I_{-1}))$ wherein d=amount of shift.

The X-direction overlay measurement (or overlay alignment) by DBO is also applicable to Y-direction overlay measurement by switching Y and X directions (or by rotation of 90 degrees). This way, both Y- and X-direction overlay measurements can be performed.

Figure 5:
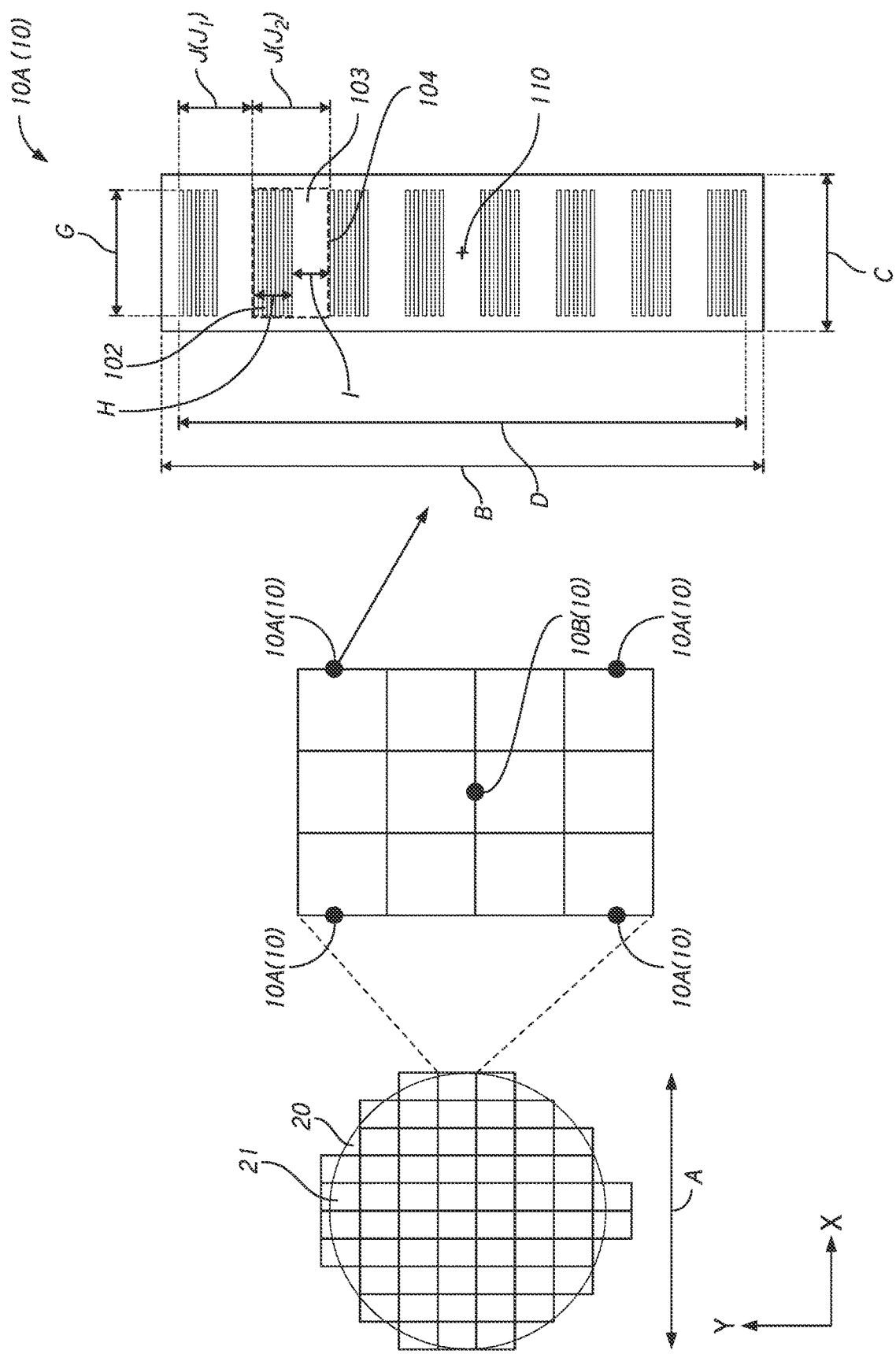
FIG. 5 depicts a wafer and a scribe layout including an alignment-overlay mark in a plan view according to an embodiment of the disclosure.

FIG. 5 depicts another example of a wafer and a scribe layout including the alignment-overlay mark 10 in a plan view according to an embodiment of the disclosure. In the example of FIG. 5, the alignment-overlay mark 10A in the Y-scribe includes only the second marks 102, unlike the overlay mark 10A including also the first marks 101 in FIG. 2. The same goes for the alignment-overlay mark 10B in the X-scribe (see FIG. 8C). This configuration is further beneficial in a case where the wafer 20 has a smaller area for the Y-scribe and/or X-scribe.

As one example, the wafer 20 has the same diameter A of 300 mm as that in FIG. 2, and Y-scribe, or at least part of the Y-scribe secured for the alignment-overlay mark 10A, has the same length B of 125 um as that in FIG. 2; however, the width C of the Y-scribe is 20 um, which is half the width C, 40 um, of the Y-scribe in FIG. 2. Each second mark 102 fits in the half-sized Y-scribe and has the same X-direction length G of 20 um, the same Y-direction length H of 8 um, the same Y-direction gap length I of 8 um, and the same Y-direction pitch J of 16 um as those in the example of FIG. 2. The center 110 of the alignment-overlay mark 10A in Y and X directions remains the same.

Figure 6A:
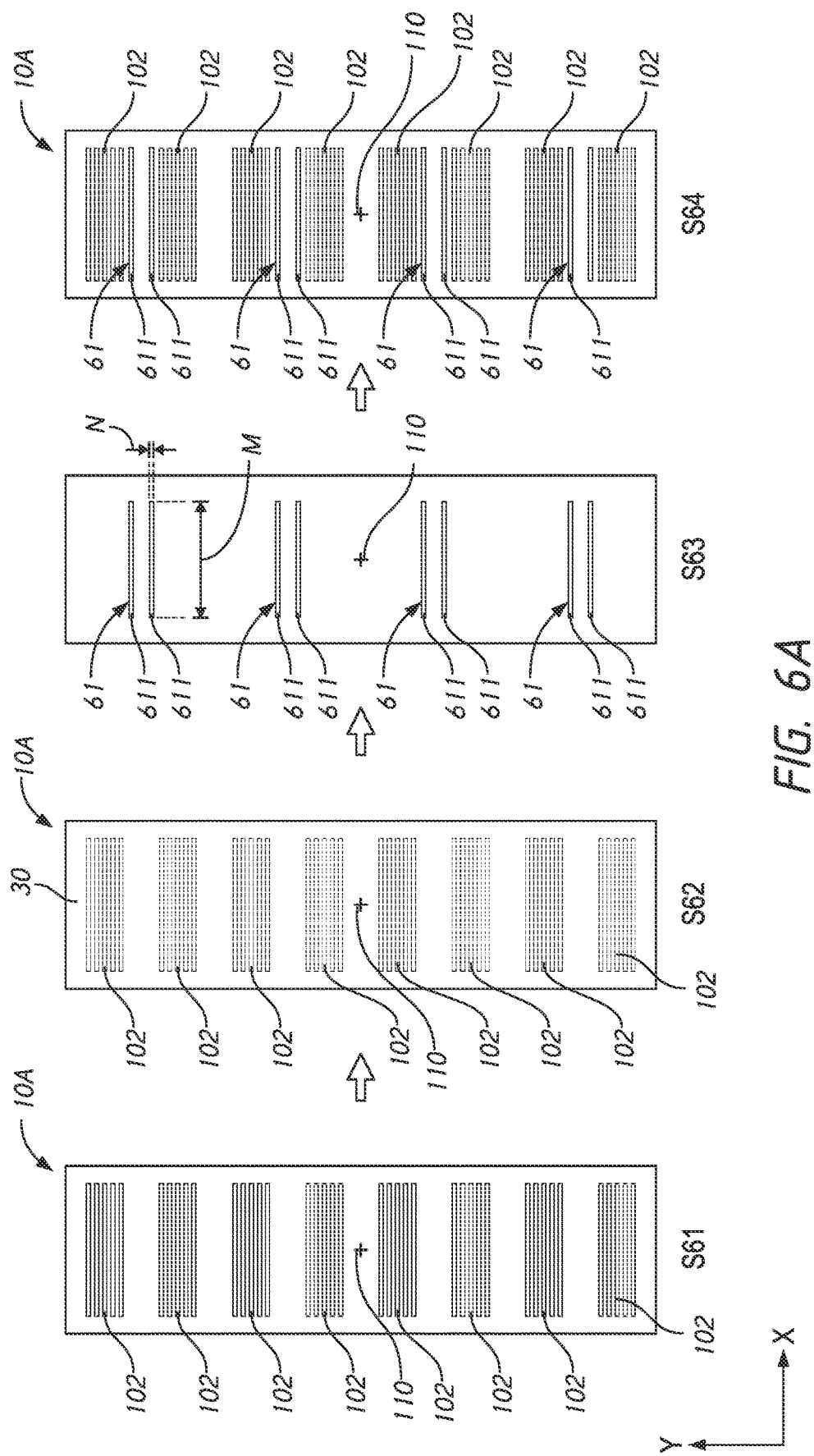
FIGS. 6A and 6B depict a method of alignment using an alignment-overlay mark according to an embodiment of the disclosure.
Figure 6B:
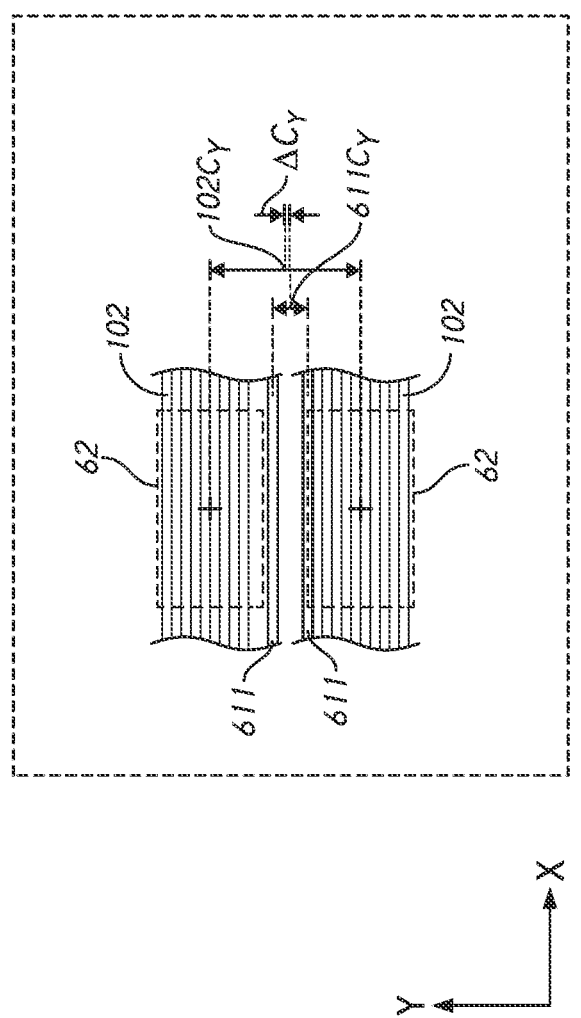

FIGS. 6A and 6B depict an example of a method of alignment using the alignment-overlay mark 10A (10) of FIG. 5 according to an embodiment of the disclosure.

As shown in FIG. 6A, in a similar manner to the example in FIG. 3A (S31 and S32), prior to the alignment, the alignment-overlay mark 10A is printed in the first, previous layer in the Y-scribe (or X-scribe in the case of the alignment-overlay mark 10B (see FIG. 8C)) on the wafer by a lithography apparatus (S61), and subsequently, a resist layer 60 as the second, current layer is deposited over the previous layer including the alignment-overlay mark 10A (S62). Then, in the same manner as the example in FIG. 3A (S32), as the first stage of the alignment (S62), the wafer alignment process is performed in the current layer by using the alignment-overlay mark 10A through the deposited resist layer 60 by the same lithography apparatus that has formed the previous layer.

Next, in a similar manner to the example in FIG. 3A (S33), a plurality of resist patterns 61 are formed or printed in the current resist layer by the lithography apparatus (S63), except that a structure of each of the resist patterns 61 is different from the resist pattern 31.

In the example, each resist pattern 61 includes a pair of bars (may also be referred to as lines) 611 extending in X direction (or Y direction in the case of the alignment-overlay mark 10B in the X-scribe (see FIG. 8C)) and are arranged in parallel to each other in Y direction (or X direction in the case of the alignment-overlay mark 10B in the X-scribe (see FIG. 8C)). When viewed from above, the bars 611 of the current layer fit in an area defined between the neighboring second marks 102 of the alignment-overlay mark 10A of the previous layer. The bars 611 run along the neighboring second marks 102 in the defined area, respectively, when viewed from above. As one example, each bar 611 may have the same Y-direction length or width N of 0.5-1.0 um as the second bar 312 of the resist pattern 31 in FIG. 3A, but it may have a longer X-direction length M than the second bar 312 because there is more X-direction space in the defined area between the neighboring second marks 102 for the bars 611 than that of the example in FIG. 3A.

Then, an overlay alignment process as a second stage of the alignment is performed using the alignment-overlay mark 10 in the previous layer and the corresponding resist pattern 60 in the current layer (S64). In a similar manner to the example in FIG. 3B, an overlay error or overlay misalignment is measured between the alignment-overlay mark 10 of the previous layer and the resist pattern 61 of the current layer using the IBO technique by a metrology apparatus.

As shown in FIG. 6B, in the case of IBO in Y direction, a center $102C_Y$ between the neighboring second marks 102 of the alignment-overlay mark 10A in the first, previous layer in Y direction is determined. A center $611C_Y$ between the bars 611 of the resist pattern 61, which correspond to the neighboring second marks 102, in the second, current layer in Y direction is also determined. The center $102C_Y$ is a position equally distanced in Y direction between a Y-direction center (indicated with a cross mark in the enlarged view of the drawing) of one of the neighboring second marks 102 and a Y-direction center (indicated with another cross mark in the enlarged view of the drawing) of another one of the neighboring second marks 102. The center $611C_Y$ is a position equally distanced in Y direction between the two bars 611. In one instance, two sections (or regions or windows for alignment inspection) 62 designated for Y-direction overlay alignment may be defined (as indicated with a doted rectangle in the drawing) to cover at least portions of the respective neighboring second marks 102 in the image of the alignment-overlay mark 10, the centers of the defined sections 62 are obtained by image analysis, and the center $102C_Y$ is calculated based on the centers of the defined sections 62. Likewise, the center $611C_Y$ may be obtained by analyzing the image of the alignment-overlay mark 10 capturing at least a portion of each of the bars 611 for center calculation. A value of misalignment $\Delta C_Y$ in Y direction is then obtained by, for example, calculating a difference between the two centers $102C_Y$ and $611C_Y$.

In the case of IBO in X direction, the alignment-overlay mark 10B in the X-scribe (see FIG. 8C), which is the same as the 90-degree rotated version of the alignment-overlay mark 10A, may be used. The processes S62, S63, and S64 may be performed with respect to the alignment-overlay mark 10B in the previous layer and the corresponding resist patterns 61 including the bars 611 each extending in Y direction (instead of X direction in the Y-scribe) in the current layer in the X-scribe. The measurement and calculation of the relevant centers and thus the misalignment value $\Delta C_X$ (not separately depicted) are the same as those in the case of the Y-scribe.

Figure 7A:
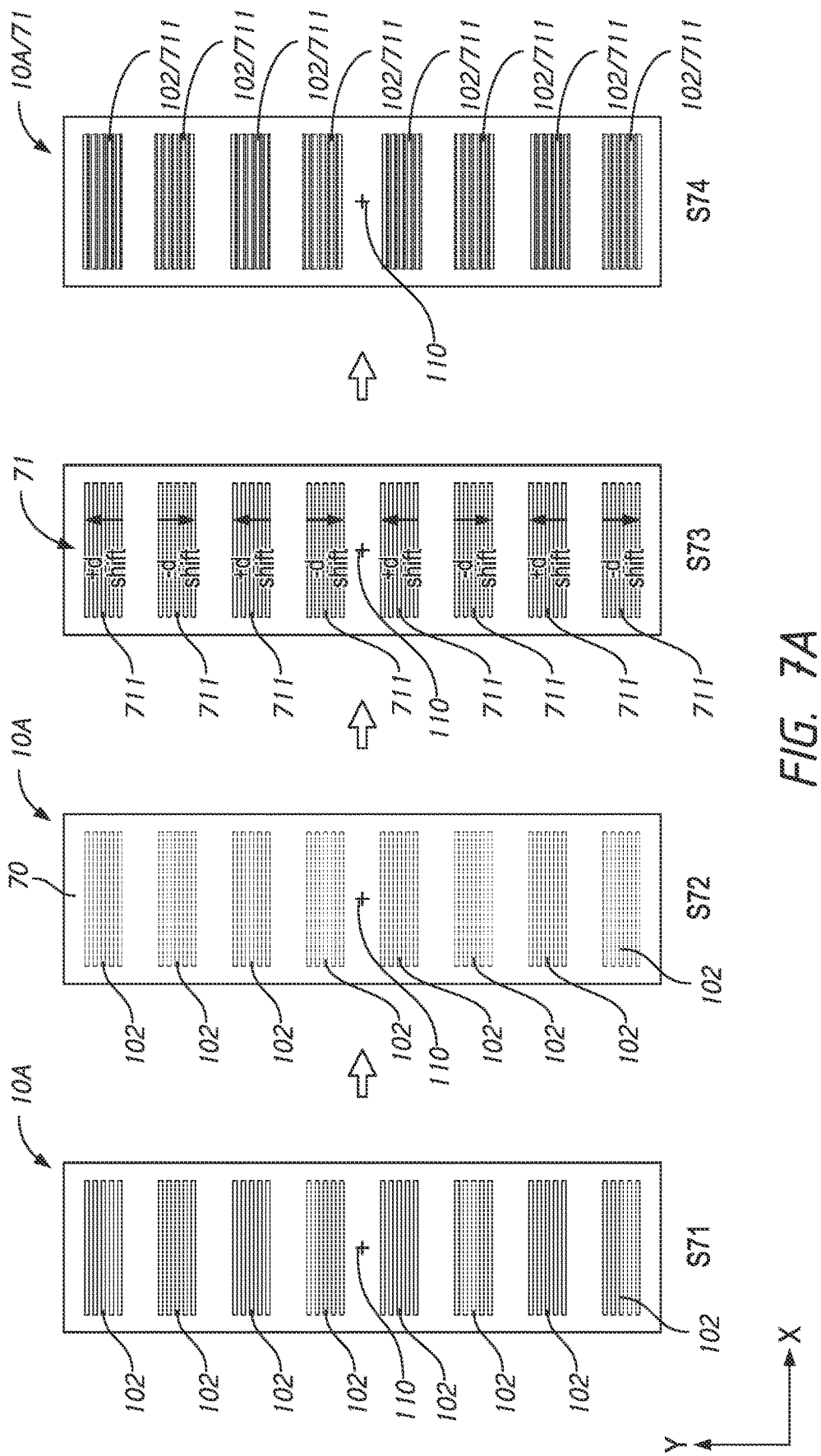
FIGS. 7A and 7B depict a method of alignment using an alignment-overlay mark according to an embodiment of the disclosure.
Figure 7B:
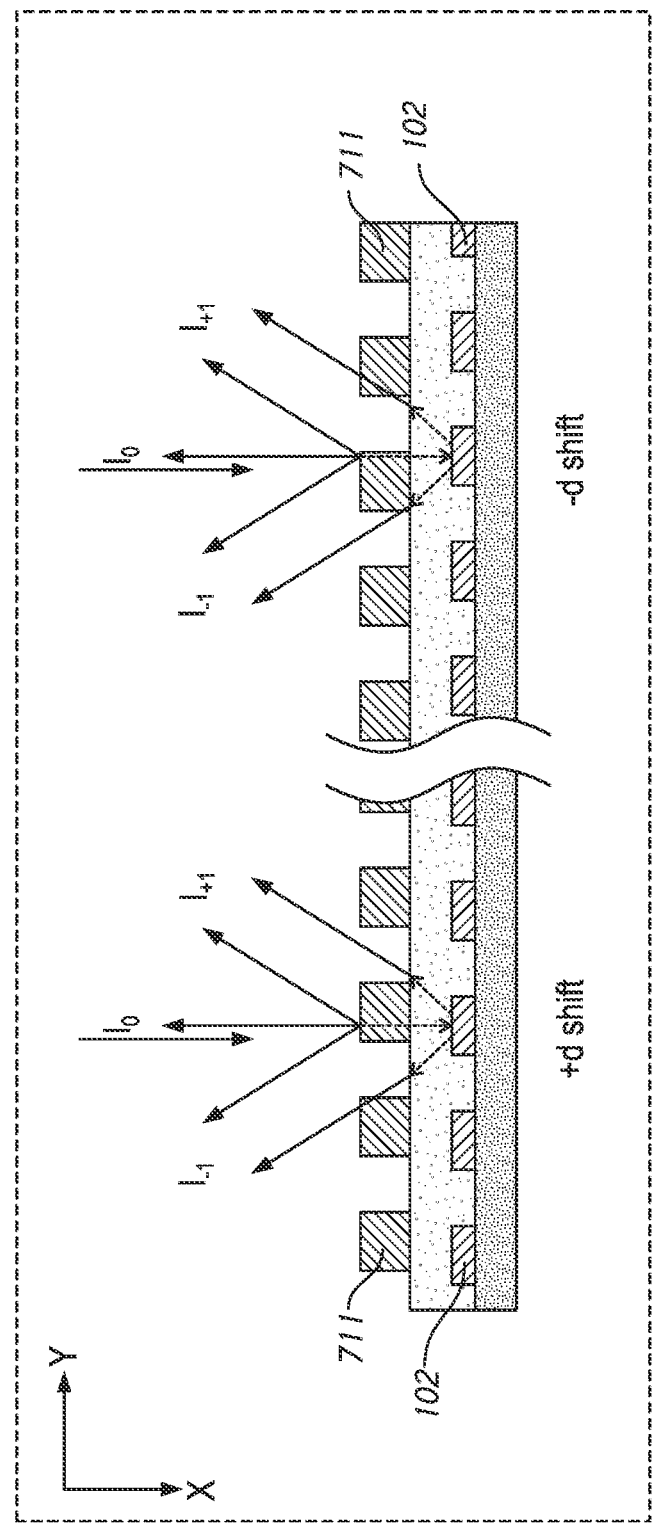

FIGS. 7A and 7B depict another example of a method of alignment using the alignment-overlay mark 10A of FIG. 5 according to an embodiment of the disclosure.

The process of forming the alignment-overlay mark 10A (S71) and the process of depositing a resist layer 70 (S72) are the same as those in the example of FIG. 6A. Then, in the current layer, a resist pattern 71 is printed by the lithography apparatus. The resist pattern 71 in the current layer corresponds to the alignment-overlay mark 10A in the previous layer when viewed from above.

In the example, the resist pattern 71 includes the structure that corresponds to or is substantially the same as the alignment-overlay mark 10A but is shifted, to some extent, from the alignment-overlay mark 10A in Y direction when viewed from above. In the drawing, such shifts are indicated as +d shift and −d shift.

The resist pattern 71 includes a plurality of patterns 711 corresponding to the respective second marks 102. In the example, each of the patterns 711 includes a plurality of bars corresponding to the plurality of bars of each of the second marks 102.

Neighboring patterns 711 (or the respective bars thereof) among the plurality of patterns 711 are shifted in opposite directions to each other (+d and −d) in Y direction. For example, one of the neighboring patterns 711 is shifted upwardly in Y direction as indicated with +d shift in the drawing. Another one of the neighboring patterns 711 is shifted downwardly opposite to the +d shift in X direction as indicated with −d shift in the drawing. The same goes for the rest of the patterns 711. Every other patterns 711 are shifted in either +d or −d. The patterns 711 are shifted in +d and −d alternately.

The shifted structure of the resist pattern 71 in the Y-scribe is also applicable to a resist pattern in the X-scribe (see FIG. 8D) by switching Y and X directions (or by rotating the illustrated structure 90 degrees).

As with the example of FIGS. 4A and 4B, based on the resist pattern 71 in the current layer and the alignment-overlay mark 10 (10A and/or 10B) in the previous layer, an overlay alignment process as a second stage of the alignment is performed using DBO by a metrology apparatus (S74). The enlarged view in FIG. 7B illustrates an example of DBO in Y direction applied to the second marks 102 of the alignment-overlay mark 10A and the patterns 711 of the resist pattern 71. In a similar manner to the example of FIG. 4B, the patterns 711 in the second layer forms a grating (may also be referred to as a top grating) with the plurality of bars or lines, the second marks 102 in the first layer forms a grating (may also be referred to as a bottom grating) with the plurality of bars or lines (see also FIG. 1). When both top and bottom gratins are irradiated with light $I_0$, diffraction lights $I_{+1}$ and $I_{-1}$ are generated off the gratings. With the −d shift structure, for example, the diffraction light $I_{-1}$ diffracted from the top and bottom gratings to one side in Y direction has a higher intensity than the diffraction light $I_{+1}$ diffracted from the top and bottom gratings to an opposite side in Y direction. With the +d shift structure, for example, the diffraction light $I_{+1}$ diffracted from the top and bottom gratings to one side in Y direction has a higher intensity than the diffraction light $I_{-1}$ diffracted from the top and bottom gratings to another side in Y direction. The diffraction light $I_{+1}$ and $I_{-1}$ are thus asymmetry in intensity. The differences in intensity then lead to an error or misalignment in overlay of the second marks 102 and the patterns 711 by calculating, for example, $d*((I_{+1}+I_{-1})/(I_{+1}-I_{-1}))$ wherein d=amount of shift.

This Y-direction overlay measurement (or overlay alignment) by DBO in the Y-scribe is also applicable to X-direction overlay measurement in the X-scribe (see FIG. 8D) with respect to the alignment-overlay mark 10B and the resist pattern 71 by switching Y and X directions (or by rotation of 90 degrees). This way, both Y- and X-direction overlay measurements can be performed.

FIGS. 8A-8B depict the alignment-overlay marks 10B and the resist patterns 31, 41, 61, and 71 in the X-scribe which correspond to the alignment-overlay marks 10A and the resist patterns 31, 41, 61, and 71 in the Y-scribe of FIGS. 3, 4, 6, and 7, respectively, in a plan view. While, in one case, the alignment-overlay marks 10A and 10B are formed in the same previous layers, in another case, they may be formed in different previous layers. For example, the alignment-overlay mark 10A may be formed in the Y-scribe of a first previous layer and the alignment overlay mark 10B may be formed in the X-scribe of a second previous layer different from the first previous layer. The resist patterning is performed in the current layer corresponding to the respective alignment-overlay marks 10A and 10B of the first and second previous layers. The overlay alignment is performed with respect to the resist patterns and either the alignment-overlay mark 10A of the first previous layer or the alignment-overlay mark 10B of the second previous layer, depending on the direction of the overlay alignment.

Figure 9:
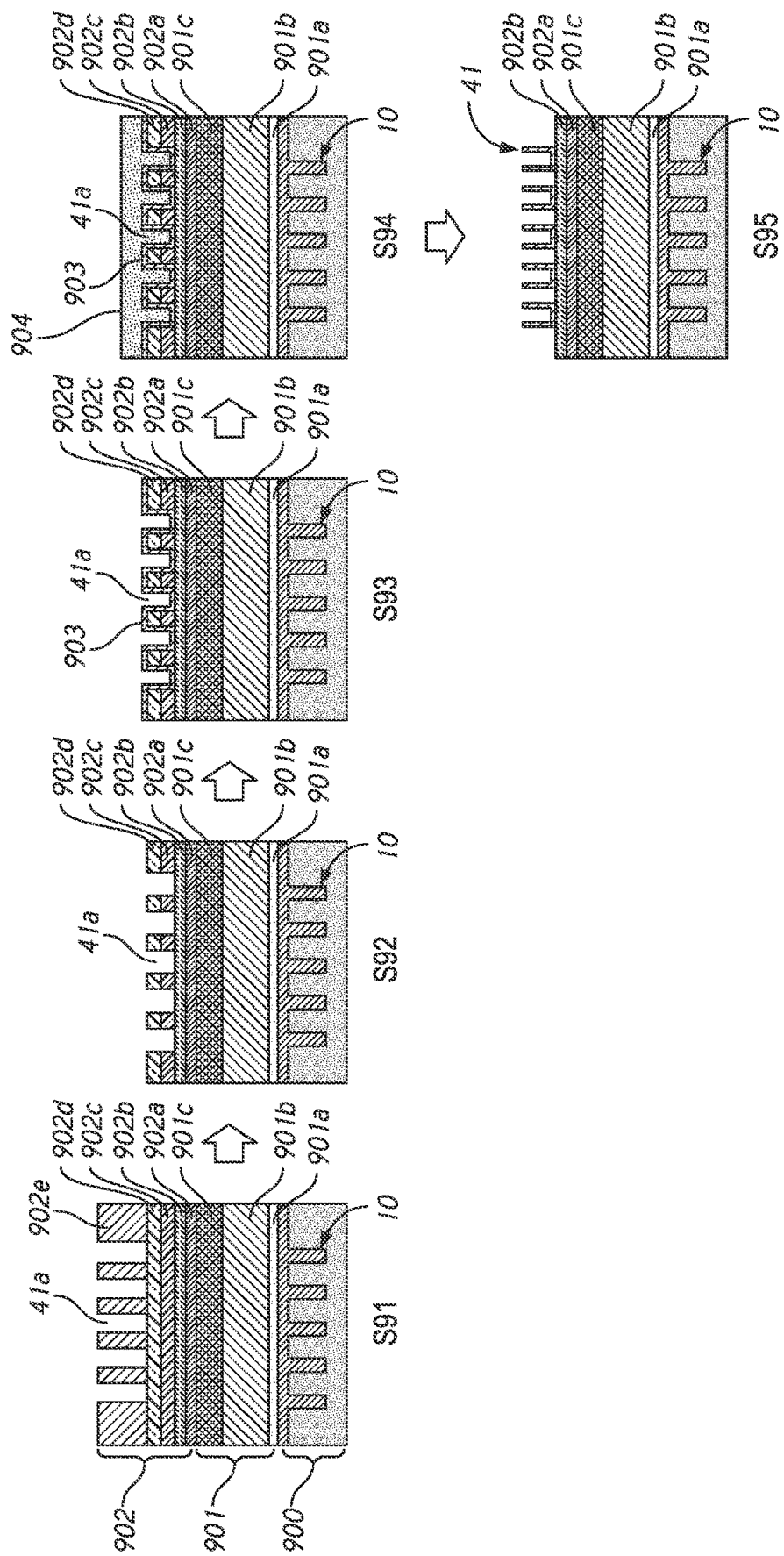
FIG. 9 depicts a method of forming a resist pattern corresponding to an alignment-overlay mark in a cross-sectional view according to an embodiment of the disclosure.

FIG. 9 depicts an example of a method of forming at least part of the resist pattern 41 of FIG. 4A corresponding to the alignment-overlay mark 10 in a cross-sectional view according to an embodiment of the disclosure.

As shown in FIG. 9, a process stack 901 is provided to the first layer (which is also referred to as the previous layer herein) 900, which is made of, for example, silicon (Si) and includes the alignment-overlay mark 10, and a photo-mask stack 902 (which is also referred to as the current layer herein) is provided on the process stack 901 (S91). The process stack 901 includes a plurality of layers, such as a metal layer 901a, a nitride layer 901b, and a carbon layer 901c. The phot-mask stack 902 includes a plurality of layers, such as dielectric anti-reflective coating (DARC) layers 902a and 902b, an underlayer (UL) coating layer 902c, a hard mark layer 902d, and a resist layer 902e. Exposure and development are applied to the resist layer 902e to form a pattern 41a. The pattern 41a shown in FIG. 9 is an example of a part of the first pattern 411 or the second pattern 412 of the resist pattern 41 in FIG. 4A. Each of the first pattern 411 and the second pattern 412 includes the bars or lines as shown in FIG. 4A to form the grating for the overlay measurement. The pattern 41a has the corresponding bars of the grating. Such bars are projected through a reticle including a corresponding pattern by a lithography apparatus.

Next, a hard mask etching process is applied to transfer the pattern 41a to the UL coating layer 902c and the hard mask layer 902d (S92). An oxide spacer 903 is deposited onto the transferred pattern 41a in the UL coating layer 902c and the hard mask layer 902d (S93). Another UL coating layer 904 is deposited onto the oxide spacer 903 to further planarity during the next etching process (S94).

Finally, an etchback process is performed to remove the UL coating layer 904 and the oxide spacer 903 (S95). The resulting structure on the exposed surface, which is the DARC layer 902b in the example, provides the resist pattern 41 in the current layer which corresponds to the alignment-overlay mark 10 in the underlying previous layer. The overlay measurement or alignment is then performed between the alignment-overlay mark 10 and the resist pattern 41 (see FIG. 4B).

The processes S91-S95 may be performed using any conventional methods suitable for forming resist patterns by a lithography apparatus. The processing shown in FIG. 9 is applicable to other resist patterns, such as the resist patterns 31, 61, and 71 in the examples of FIGS. 3, 6, and 7. The processing shown in FIG. 9 may be performed using any appropriate conventional techniques of forming a resist pattern in a resist layer.

Figure 10:
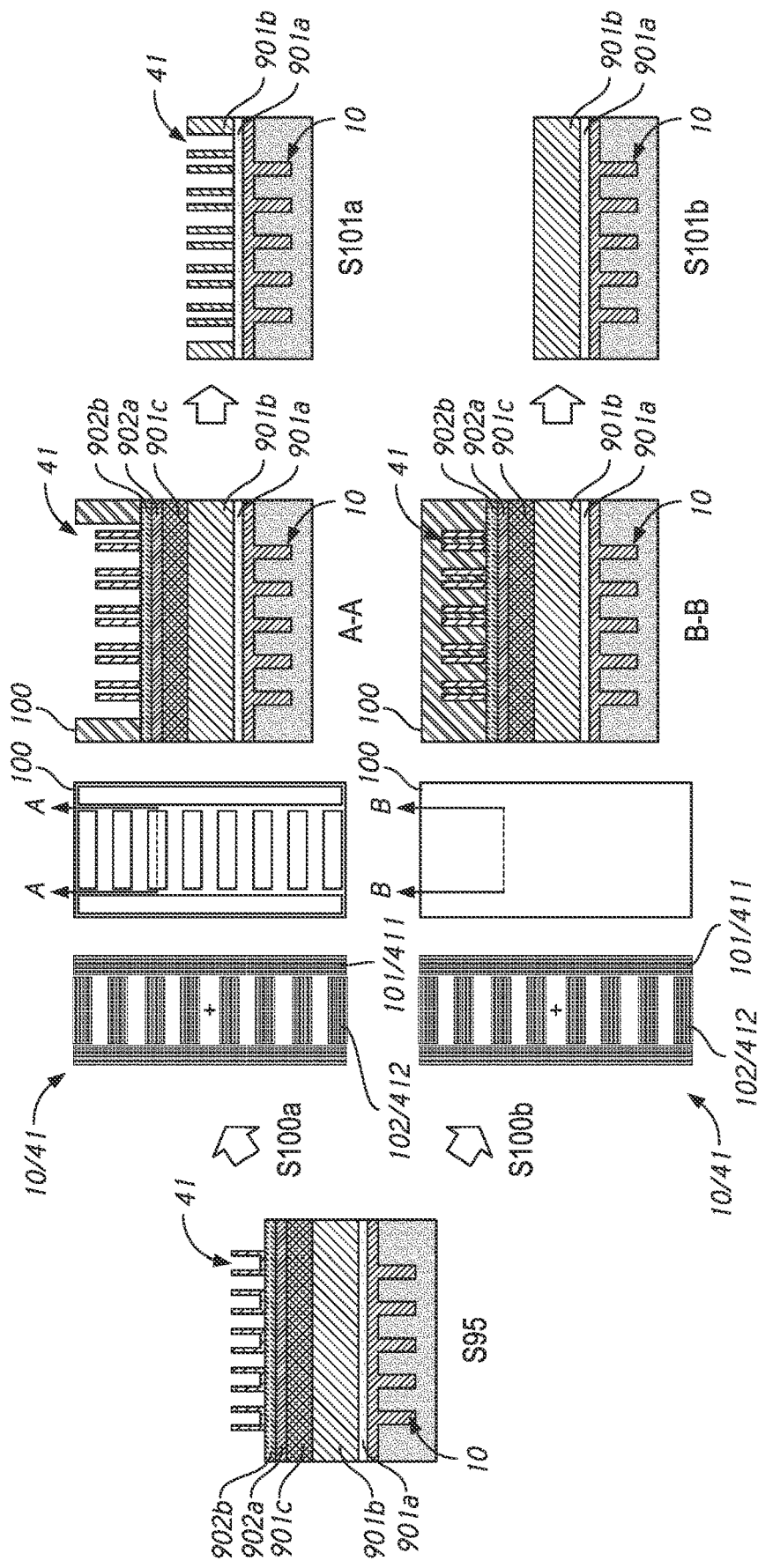
FIG. 10 depicts chop layer processing according to an embodiment of the disclosure.

FIG. 10 depicts an example of chop layer processing following the resist pattern formation of FIG. 9 according to an embodiment of the disclosure.

Once the overlay alignment is performed with respect to the resist pattern 41 in the current layer, a chop layer 100 may be provide to the layer of the resist pattern 41 (S100a/S100b). The chop layer 100 includes, for example, resist. The chop layer 100 may also be referred to as a chop mask. The chop layer 100 is used to select whether or not the resist pattern 41 is to be further transferred to the underlying layer of the process stack 901, such as the nitride layer 901b in the example.

In one instance, the chop layer 100 is deposited to fill a space or a gap between the resist pattern 41 on the current layer but does not cover the resist pattern 41 (S100a). In another instance, the chop layer 100 is deposited to cover the entirety of the resist pattern 41 (S100b). In the former instance, the resist pattern 41 is transferred to the underlying layer, such as the nitride layer 901b, by performing further etching (either dry or wet) and other appropriate processes. In the latter instance, the resist pattern 41 is canceled and will not be transferred to the underlying layer, and hence, the alignment-overlay mark 10 can be reused for a further alignment process. This is especially beneficial in a case where the alignment-overlay mark 10 in the previous layer is to be used multiple times. Such a case includes, but is not limited to, multiple patterning (or multi-patterning), such as litho-etch-litho-etch (LELE) by a lithography apparatus.

Although various embodiments of the disclosure have been described in detail, it will be understood by those skilled in the art that embodiments of the disclosure may extend beyond the specifically described embodiments to other alternative embodiments and/or uses and modifications and equivalents thereof. In addition, other modifications which are within the scope of the disclosure will be readily apparent to those of skill in the art based on the described embodiments. It is also contemplated that various combination or sub-combination of the specific features and aspects of the embodiments may be made and still fall within the scope of the disclosure. It should be understood that various features and aspects of the embodiments can be combined with or substituted for one another in order to form varying mode of the embodiments. Thus, it is intended that the scope of the disclosure should not be limited by the particular embodiments described above.

What is claimed is:

1. An alignment-overlay mark, comprising:
a pair of first marks extending in a first direction and arranged in parallel to each other in a second direction, the second direction perpendicular to the first direction, wherein each of the first marks includes a plurality of first bars extending in the first direction and arranged in parallel to each other in the second direction; and
a plurality of second marks between the first marks, the second marks extending in the second direction and arranged in parallel to each other in the first direction, wherein each of the second marks includes a plurality of second bars extending in the second direction and arranged in parallel to each other in the first direction, wherein
a width of each of the first marks in the second direction is the same as a length of each of the second marks in the first direction,
a gap length between neighboring second marks of the plurality of second marks in the first direction is the same as the length of each of the second marks in the first direction, and
a length of the alignment-overlay mark in the first direction is the same as a length of each of the first marks in the first direction, a width of the alignment-overlay mark in the second direction is the same as a width of the pair of the first marks in the second direction, and the length of the alignment-overlay mark in the first direction is greater than the width of the alignment-overlay mark in the second direction.

2. The alignment-overlay mark according to claim 1, wherein a first pitch in the first direction between neighboring second marks is substantially equal to a second pitch in the first direction between other neighboring second marks among the plurality of second marks.

3. The alignment-overlay mark according to claim 1, wherein
the neighboring second marks among the plurality of second marks have a gap therebetween in the first direction,
one of the neighboring second marks and the gap define one section, and
the one section is equally split between the one of the neighboring second marks and the gap.

4. The alignment-overlay mark according to claim 1, wherein
a first pitch in the first direction between neighboring second marks is substantially equal to a second pitch in the first direction between other neighboring second marks among the plurality of second marks,
the neighboring second marks have a gap therebetween in the first direction,
one of the neighboring second marks and the gap define one section, and
the one section is equally split between the one of the neighboring second marks and the gap.

5. The alignment-overlay mark according to claim 1, wherein the first marks and the second marks are in a scribe on a wafer.

6. A method, comprising:
performing a first alignment using an alignment-overlay mark in a first layer on a wafer, the alignment-overlay mark comprising:
a pair of first marks extending in a first direction and arranged in parallel to each other in a second direction, the second direction perpendicular to the first direction, wherein each of the first marks includes a plurality of first bars extending in the first direction and arranged in parallel to each other in the second direction; and
a plurality of second marks between the first marks, the second marks extending in the second direction and arranged in parallel to each other in the first direction, wherein each of the second marks includes a plurality of second bars extending in the second direction and arranged in parallel to each other in the first direction; and
a gap between neighboring second marks among the plurality of second marks in the first direction, wherein
a width of each of the first marks in the second direction is the same as a length of each of the second marks in the first direction,
a length of the gap between the neighboring second marks in the first direction is the same as the length of each of the second marks in the first direction,
a length of the alignment-overlay mark in the first direction is the same as a length of each of the first marks in the first direction, a width of the alignment-overlay mark in the second direction is the same as a width of the pair of the first marks in the second direction, and the length of the alignment-overlay mark in the first direction is greater than the width of the alignment-overlay mark in the second direction, and a first pitch in the first direction between the neighboring second marks is substantially equal to a second pitch in the first direction between other neighboring second marks among the plurality of second marks, one of the neighboring second marks and the gap define one section, and the one of the neighboring second marks occupies one half of the one section, and the gap occupies another half of the one section; and performing a second alignment between a resist pattern in a second layer and the alignment-overlay mark in the first layer, the resist pattern corresponding to the alignment-overlay mark.

7. The method according to claim 6, wherein
the resist pattern includes a pair of first bars extending in the first direction and arranged in parallel to each other in the second direction, the first bars in the second layer running along the corresponding first marks of the alignment-overlay mark in the first layer when viewed from above, and the resist pattern further includes a pair of second bars extending in the second direction and arranged in parallel to each other in the first direction, the second bars in the second layer running along the corresponding second marks of the alignment-overlay mark in the first layer when viewed from above.

8. The method according to claim 7, wherein
performing the first alignment includes comparing a first center of the alignment-overlay mark to a predetermined position, and performing the second alignment includes comparing a second center between the neighboring first marks of the alignment-overlay mark in the second direction to a third center between the first bars of the resist pattern in the second direction.

9. The method according to claim 7, wherein
performing the first alignment includes comparing a first center of the alignment-overlay mark to a predetermined position, and performing the second alignment includes comparing a second center between the neighboring second marks of the alignment-overlay mark in the first direction to a third center between the second bars of the resist pattern in the first direction.

10. The method according to claim 6, wherein
the resist pattern includes a plurality of first patterns corresponding to the first marks of the alignment-overlay mark but shifted from the respective first marks in the second direction when viewed from above, and the resist pattern further includes a pair of second patterns corresponding to the pair of the second marks of the alignment-overlay mark but shifted from the respective second marks in the first direction when viewed from above.

11. The method according to claim 10, wherein
performing the first alignment includes comparing a first center of the alignment-overlay mark to a predetermined position, and performing the second alignment includes comparing diffraction light intensities between the alignment-overlay mark in the first layer and the resist pattern in the second layer.

\* \* \* \* \*